US010163736B2

(12) United States Patent
Hugon

(10) Patent No.: US 10,163,736 B2
(45) Date of Patent: Dec. 25, 2018

(54) ELECTROLUMINESCENT LIGHT SOURCE WITH AN ADJUSTED OR ADJUSTABLE LUMINANCE PARAMETER AND METHOD FOR ADJUSTING A LUMINANCE PARAMETER OF THE ELECTROLUMINESCENT LIGHT SOURCE

(71) Applicant: ALEDIA, Grenoble (FR)

(72) Inventor: Xavier Hugon, Teche/Vinay (FR)

(73) Assignee: ALEDIA, Grenoble (FR)

( * ) Notice: Subject to any disclaimer, the term of this patent is extended or adjusted under 35 U.S.C. 154(b) by 0 days.

(21) Appl. No.: 15/536,640

(22) PCT Filed: Dec. 22, 2015

(86) PCT No.: PCT/EP2015/081063
§ 371 (c)(1),
(2) Date: Jun. 21, 2017

(87) PCT Pub. No.: WO2016/102610
PCT Pub. Date: Jun. 30, 2016

(65) Prior Publication Data
US 2017/0352601 A1 Dec. 7, 2017

(30) Foreign Application Priority Data
Dec. 23, 2014 (FR) ..................... 14 63179

(51) Int. Cl.
H01L 21/66 (2006.01)
H01L 25/075 (2006.01)
H01L 27/15 (2006.01)
H01L 33/62 (2010.01)
C09K 11/06 (2006.01)
H01L 33/08 (2010.01)

(52) U.S. Cl.
CPC .............. H01L 22/24 (2013.01); C09K 11/06 (2013.01); H01L 22/20 (2013.01); H01L 25/0753 (2013.01); H01L 27/156 (2013.01); H01L 33/08 (2013.01); H01L 33/62 (2013.01); H01L 2924/0002 (2013.01)

(58) Field of Classification Search
CPC ......... H01L 22/24; H01L 33/08; H01L 33/62; H01L 25/0753; H01L 27/156; H01L 2924/0002; C09K 11/06
See application file for complete search history.

(56) References Cited

U.S. PATENT DOCUMENTS

2012/0301982 A1* 11/2012 Baur ................... F21S 48/1154
438/28

FOREIGN PATENT DOCUMENTS

DE 10 2012 102301 A1 9/2013
DE 10 2013 104273 A1 10/2014
EP 2 778 511 A2 9/2014
(Continued)

Primary Examiner — Kevin Quarterman
(74) Attorney, Agent, or Firm — Baker & Hostetler LLP

(57) ABSTRACT

An electroluminescent light source is provided with an adjusted or adjustable luminance parameter wherein: the source includes a set of segments, each segment comprising a discrete electroluminescent element or multiple discrete electroluminescent elements connected permanently to one another and having an emission area; at least a portion of the segments has different emission areas; the source comprising means for controlling at least a portion of the segments.

28 Claims, 5 Drawing Sheets

(56) References Cited

FOREIGN PATENT DOCUMENTS

WO 2007/034367 A1 3/2007
WO 2010/014032 A1 2/2010

\* cited by examiner

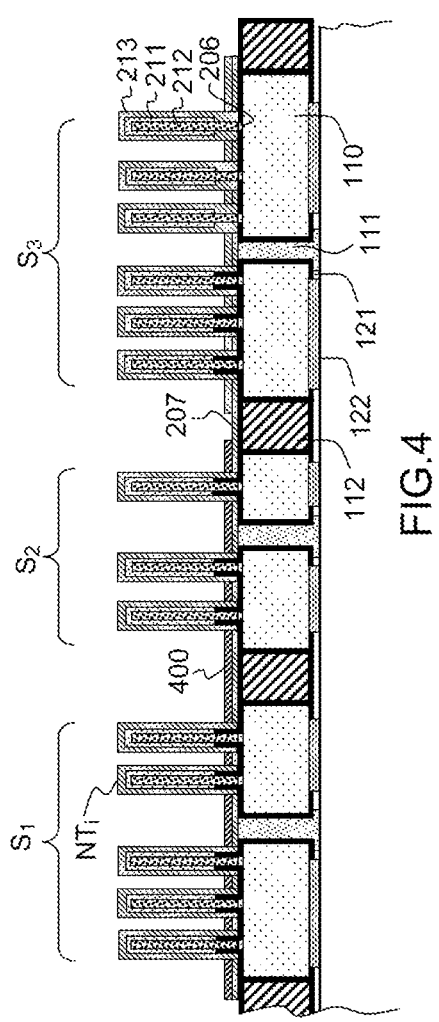
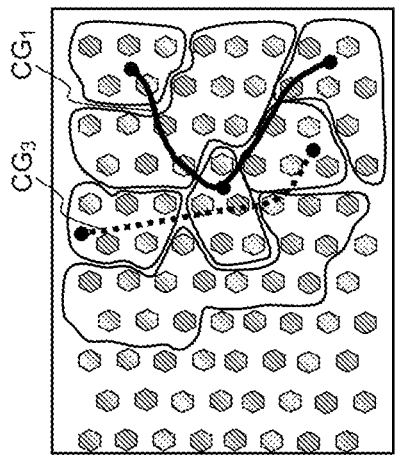
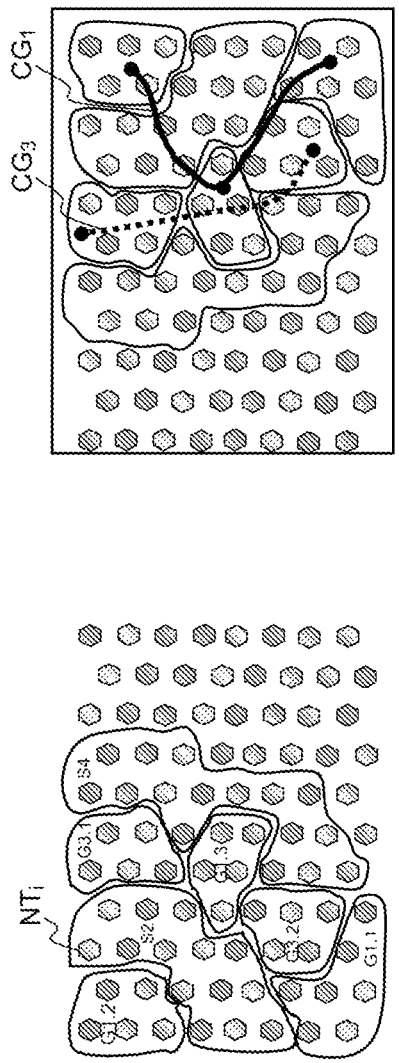
FIG.4
FIG.5a
FIG.5b

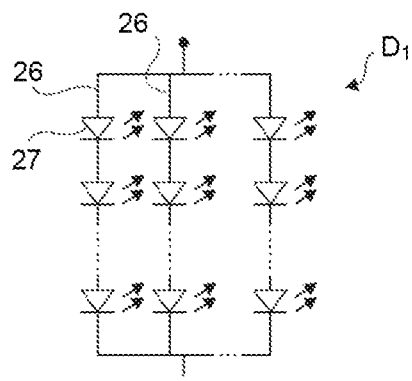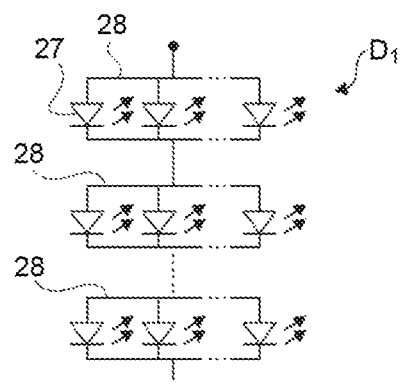
FIG.6a    FIG.6b
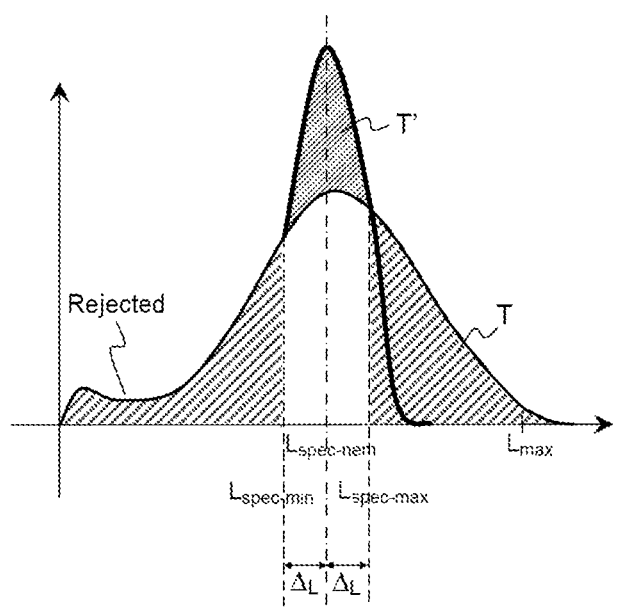
FIG.7

ELECTROLUMINESCENT LIGHT SOURCE WITH AN ADJUSTED OR ADJUSTABLE LUMINANCE PARAMETER AND METHOD FOR ADJUSTING A LUMINANCE PARAMETER OF THE ELECTROLUMINESCENT LIGHT SOURCE

CROSS-REFERENCE TO RELATED APPLICATIONS

This application is a National Stage of International patent application PCT/EP2015/081063, filed on Dec. 22, 2015, which claims priority to foreign French patent application No. FR 1463179, filed on Dec. 23, 2014, the disclosures of which are incorporated by reference in their entirety.

FIELD OF THE INVENTION

The field of the invention is that of electroluminescent light sources of light-emitting diode type, commonly referred to by the acronym LED.

BACKGROUND

Currently, LED manufacturing yields are quite heavily affected by variations in characteristics relating to the change in their luminance with applied voltage L(V) or the variation in their luminance with control current L(I), or indeed in the maximum luminance that may be obtained Lmax.

In general, lamp or bulb manufacturers mount tens, or indeed hundreds, of individual LEDs in a system. These LEDs are connected either in series (the same current for all) or in parallel (the same voltage for all) or else by combining the two. Variations from LED to LED have a very negative effect on the uniformity of appearance, indeed for the functionality of the system, resulting in integrators having to specify an acceptable range of pairs in terms of control voltage and luminance (V, L) or of control current and luminance (I, L). LED manufacturers must therefore sort components on the basis of these parameters at the end of the production line and reject all those components which do not fall within the desired range. The greater the dispersion in the performance of components, the greater the drops in yield.

In general, to produce an LED device, individual electroluminescent elements, which may be 2D or 3D at the emission surface, can be formed on the surface of one and the same substrate, each of these individual elements, which are connected in series and/or in parallel, being supplied with power so as to produce light, via a control circuit. It is still possible to have variations in performance from one individual element to the other, resulting in fluctuations in overall performance levels, while integrators have to meet performance constraints that fall within a defined range.

Generically, it is specified that an LED chip corresponds to a monolithic element the matter of which has been organized so as to form an electroluminescent structure, having at least two electrical accesses for its power supply. An LED component is a chip (monolithic element) in a package that provides all or some of the electrical, thermal, mechanical and optical interfaces with the user system. It should be noted that the package may amount to a particular coating of the chip allowing it to be directly used in the system (the chip-on-board technique for example).

More specifically and in a known manner, individual LEDs may feature planar microstructures, referred to as 2D microstructures, and/or 3D microstructures or nanostructures comprising filamentous, conical, frustoconical or pyramidal three-dimensional elements. Throughout the rest of the present description, the term "wire" will refer to any three-dimensional element of one of the above-mentioned types. The lateral dimensions (diameter) of wires may for example be of the order of several hundreds of nanometers and their vertical dimension may reach up to a few tens of micrometers, with a height/diameter ratio of between 1 and 30 and typically of around 10.

In the last few years, visible light-emitting diodes based on vertical InGaN/GaN wires containing a p-n junction and connected collectively in parallel have for example been produced.

By virtue of their potential intrinsic properties (high crystal quality, strain relaxation at the vertical free surfaces, high light extraction efficiency via waveguiding, etc.), wires are also considered to be very promising candidates for the production of electroluminescent devices.

Two approaches for producing LEDs based on wires, using different growth techniques, have already been proposed.

The first technological approach consists in growing GaN wires containing InGaN quantum wells epitaxially in an axial configuration by molecular beam epitaxy (MBE). Devices fabricated from these wires have yielded very promising results in the green spectral domain. Processed chips of 1 mm$^2$ are able to emit about 10 µW at 550 nm for a DC operating current of 100 mA.

With the molecular beam epitaxy (MBE) growth technique, certain non-uniformities appear because of random nucleation mechanisms, but typically an optical power of 50 nW has been obtained for a single wire emitting at 550 nm, i.e. 5 W/mm$^2$ with around a hundred thousand emitting wires/mm$^2$.

More recently, the metal organic chemical vapor deposition (MOCVD) growth technique has allowed InGaN/GaN wires containing a radial LED structure (core/shell configuration) to be produced.

FIG. 1 illustrates this type of configuration, in which wires NT; are produced on the surface of a substrate 11 covered with a nucleation layer 21, a lower contact layer 10 also being provided. Localized epitaxy is achieved by means of a mask 20. The wires have a core/shell structure. The core 30 can comprise an n-doped GaN material, typically with a dopant density of $10^{19}$ cm$^{-3}$; a quantum well structure made up of alternating layers that may potentially be made of InGaN and undoped GaN, respectively; and lastly a shell 31 that can consist of a p-doped GaN layer, typically with a dopant density of $10^{19}$ cm$^{-3}$.

A dielectric layer 40 provides insulation between the lower and upper contacts.

The upper contact is made via a conductive upper layer 50 that is transparent to the emission wavelength of the photoconductive structure. A metal contact layer 60 is also provided.

In this approach, since the LED structure has a core/shell configuration, the area of the active zone is larger than in the 2D wire LED approach.

This property has two advantages: it increases the emissive area and decreases current densities in the active zone. Complete MOCVD wire LED structures have been produced on a silicon substrate, and light emission in the blue spectral domain (450 nm) has been obtained for an integrated array of wires after technological processing.

By virtue of the technologies used to grow the wires, hundreds of thousands of wires may be produced on the surface of a chip on an area potentially, and typically, of 1 mm².

SUMMARY OF THE INVENTION

In this context and in order to address in particular the constraints relating to the reproducibility of electroluminescent light sources, the present patent application describes an electroluminescent light source comprising multiple discrete electroluminescent elements that may be of very small size, typically having dimensions that may be as small as a few hundred nanometers, as well as means allowing luminance parameters, and hence the reproducibility, thereof to be adjusted, the luminance resulting from the sum of the elementary luminances of at least one set of discrete electroluminescent elements that are organized in segments of different dimensions, said segments potentially being controlled independently and selectively and thus notably making it possible for manufacturers to meet dictated setpoints in terms of control voltage/luminance (V, L) or control current/luminance (I, L) pairs.

More specifically, one subject of the present invention is an electroluminescent light source with an adjusted or adjustable luminance parameter ((I, L), (V,L), ... ), characterized in that:

said source includes a set of segments, each segment comprising a discrete electroluminescent element or multiple discrete electroluminescent elements connected permanently to one another and having an emission area;

at least a portion of said segments has different emission areas;

said source comprising means for controlling at least a portion of said segments.

According to one variant of the invention, the light source comprises filamentous, conical, frustoconical or pyramidal elements on the surface of a substrate and distributed in subsets referred to as segments. According to this variant, each segment may possess a different number of discrete elements, this number potentially varying by power of 2.

According to one variant of the invention, the light source comprises a light-emitting diode (LED) having an emissive active portion that is segmented so as to define said segments, said light-emitting diode (LED) having a planar structure of stacked layers on the surface of a substrate. According to this variant, the segments may have different areas. The segments may comprise chips having areas that vary by power of two, and/or the number of chips constituting a segment varies by power of 2. According to this variant, the segments may also comprise segments the size of which varies by power of 2.

Thus, according to variants of the invention, the electroluminescent light source comprises a series of N th segments, the number of filamentous, conical, frustoconical or pyramidal elements in each th segment varying by power of 2, where N>2.

According to variants of the invention, the electroluminescent light source comprises a series of N th segments, the size of the th segments varying by power of 2, where N>2.

According to variants of the invention, the light source comprises N th segments, the chips constituting the N th segments have areas that vary by power of two, and/or in that the number of chips constituting a th segment varies by power of 2, where N>2.

According to variants of the invention, the light source comprises at least a portion of said segments consists of groups positioned non-contiguously, said groups being connected permanently to one another.

According to one variant of the invention, the light source comprises an assembly of discrete light-emitting diode (LED) chips, distributed in multiple segments consisting of one or more light-emitting diode (LED) chips. According to this variant, the segments may comprise a different number of light-emitting diodes (LEDs) or light-emitting diodes (LEDs) of different sizes.

According to variants of the invention, the segments consist of groups positioned non-contiguously, said groups constituting the segments potentially being positioned randomly.

According to variants of the invention, the discrete elements are connected electrically by means of a common upper electrode. Each group of discrete elements of one and the same segment may be connected to at least one via passing through the substrate and allowing the groups of said segment to be connected on the back face.

According to variants of the invention, the segments are connected by multiple metal levels on the processed face of the chips assembled according to the flip-chip method.

The flip-chip technique is one of the techniques used to make electrical connections. The chip is upside-down with respect to wire bonding.

According to variants of the invention, various light-emitting diodes (LEDs) constituting the segments are transferred onto a carrier that also electrically connects the segments and groups.

According to variants of the invention, the control means comprise a control circuit including means for independently activating a variable number of segments and allowing said luminance parameter of said source to be adjusted.

According to one variant of the invention, the control circuit contains conductive tracks connecting the segments to one or more metal pads enabling the wire bonding thereof when packaging said source. According to one variant of the invention, the control circuit may be a printed circuit board including conductive tracks that are linked to the segments and an electronic control module, said module allowing at least a portion of said segments to be activated via the conductive tracks. The control circuit may comprise binary control means. The conductive tracks may include means for selectively and permanently programming the pre-established connections, said means potentially being metal fusible elements. The method employed may consist in removing the metal fusible elements by means of laser ablation.

In order to provide binary control, the electronic control module may include a directory of data pairs: layout of the control tracks/overall luminance parameter of said device.

According to variants of the invention, the segments are capable of emitting in different wavelengths $\lambda_{pk}$ the combination of said segments producing an overall luminance parameter resulting from the sum of the luminance parameters of each of the segments emitting in one of said wavelengths $\lambda_{pk}$.

Another subject of the invention is a method for adjusting a luminance parameter of an electroluminescent light source according to the invention, characterized in that it comprises the following steps:

determining a reference luminance parameter value $L_{ref}$ of said electroluminescent light source;

selectively controlling segments of different emission areas of discrete electroluminescent elements so as to obtain said reference luminance parameter $Lr_{ef}$.

Yet another subject of the invention is a method for adjusting the spatial distribution of a luminance parameter of an electroluminescent light source according to the invention, characterized in that it comprises the following steps:

determining a reference spatial distribution of a luminance parameter $L_{ref(x,y)}$ of said electroluminescent light source;

selectively controlling segments of different emission areas of discrete elements so as to obtain a luminance parameter surface distribution L(x,y) that is equal to said reference spatial distribution $L_{ref(x,y)}$.

Another subject of the invention is a method for optimizing control of an electroluminescent light source according to the invention, characterized in that it comprises:

a test phase including the following steps:
determining a directory of data pairs: configuration of layout of conductive tracks/measurement of overall luminance parameter of said electroluminescent light source;
selecting, in said directory, conductive track layout configurations allowing luminance parameters that are in accordance with predefined luminance parameter specifications to be obtained;
determining an optimum layout configuration that meets the predefined specifications.

Yet another subject of the invention is a method for designing an electroluminescent light source according to the invention, characterized in that it comprises:

a step of determining reference specifications of said electroluminescent light source;
producing a control circuit including a network of conductive tracks that are intended to activate the set of segments of discrete electroluminescent elements of said electroluminescent light source;
removing a subset of connections so as to be able to activate a selection of segments of discrete electroluminescent elements in order to obtain said reference specifications.

BRIEF DESCRIPTION OF THE DRAWINGS

The invention will be better understood and other advantages will become apparent on reading the following description, which is given by way of non-limiting example, and by virtue of the appended figures in which:

FIG. 4 is a schematic representation of an electroluminescent light source including segments of discrete 3D electroluminescent elements;

FIGS. 5a and 5b are schematic representations from above and from below, respectively, of an exemplary electroluminescent light source according to the invention comprising segments including non-contiguous groups;

FIGS. 6a and 6b illustrate exemplary connection schemes for the segments used in a light source according to the invention;

FIG. 7 is a representation of the statistical distribution in luminance production of an LED light source with an active area S.

DETAILED DESCRIPTION OF THE INVENTION

In general, the light source of the present invention consists of an overall electroluminescent area S that is segmented into multiple distinct electroluminescent portions, referred to as segments.

Figure 1:
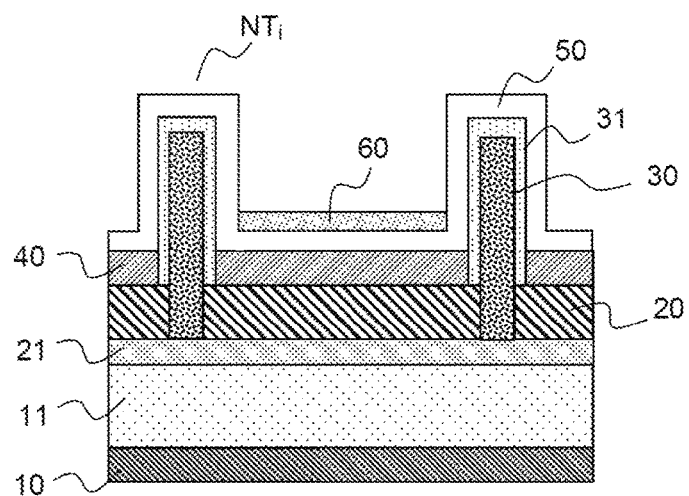
FIG. 1 illustrates an LED configuration using wires with a radial structure according to the prior art.
Figure 2:
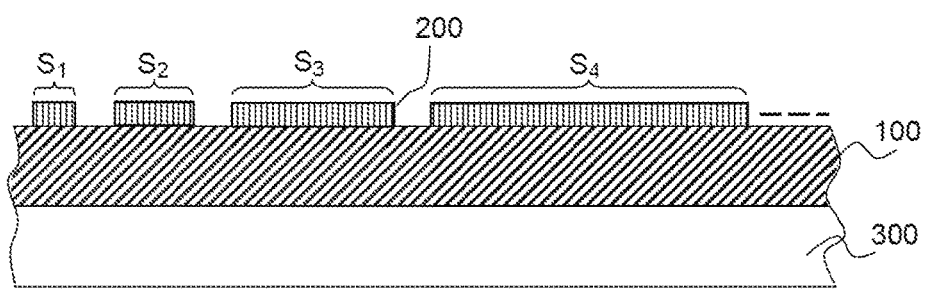
FIG. 2 is a schematic representation of an electroluminescent light source of the invention consisting of electroluminescent elements of nanostructure type, which may be those described in FIG. 1, and including segments of different emission areas that consist of a different number of electroluminescent elements.

According to one variant of the invention, the light source may be a light-emitting diode comprising a large number of wires that have been grown on the surface of a substrate and organized into segments of different emissive areas. Such a variant is illustrated in FIG. 2. FIG. 2 shows an electroluminescent light source comprising, on the surface of a substrate 100, segments $S_1$, $S_2$, $S_3$, $S_4$, . . . , of electroluminescent elements 200 with emissive areas of different sizes.

Figure 3A:
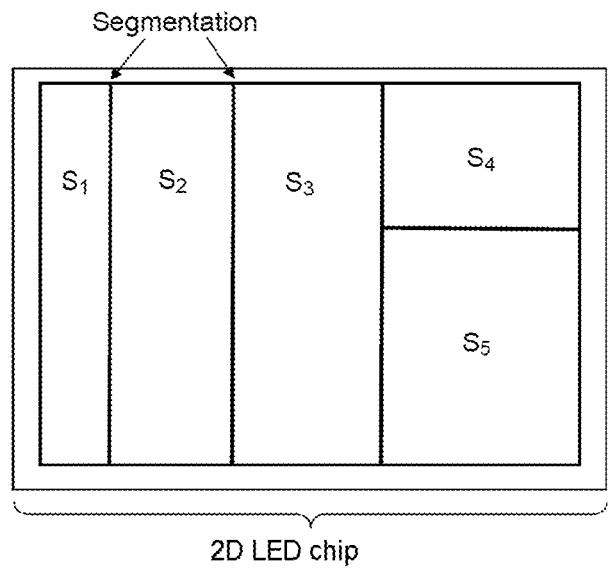
FIGS. 3a and 3b are schematic representations from above and in cross section of an electroluminescent light source with a planar structure including segments of electroluminescent elements of planar structure.
Figure 3B:
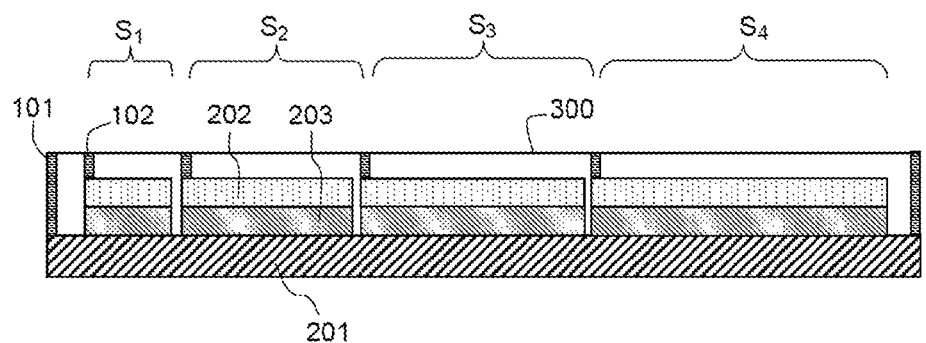

According to another variant of the invention, the light source of the invention may be a 2D light source segmented into multiple portions, each of these portions corresponding to one segment. The two FIGS. 3a and 3b illustrate this variant of the invention. FIG. 3a is a representation from above of a 2D LED with five segments $S_1$, $S_2$, $S_3$, $S_4$ and $S_5$. The black lines represent the segmentation of the active portion of the LED into various segments. FIG. 3b is a representation in cross section of the same LED with a common substrate providing the n-contact for all of the segments and a segmentation of the p-contact and of the active emissive portion. The small pads represent the electrical contact lands. More specifically, on the surface of a common substrate 201 providing n-contact, segments are formed that comprise an emissive active zone 203 and a p-type contact 202, the lands connecting to the n-contacts 101 and to the p-contacts 102, respectively, are connected to means 300 that may comprise a control circuit.

Figure 3C:
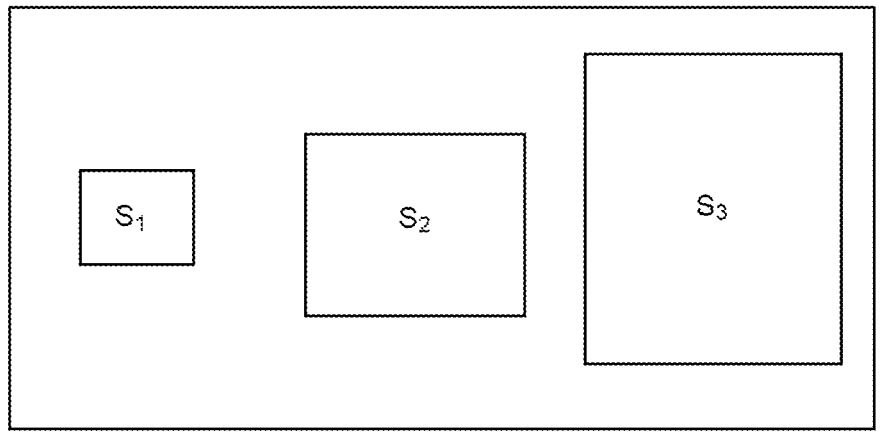
FIGS. 3c and 3d are schematic representations from above and in cross section of an electroluminescent light source including segments comprising at least one discrete electroluminescent element with a planar structure that are connected according to the flip-chip method.
Figure 3D:
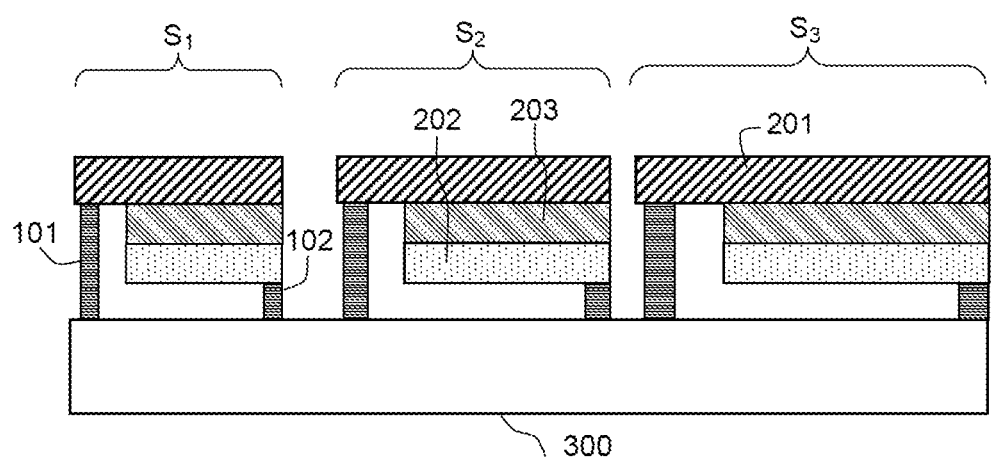

According to another variant of the invention, the light source of the invention may comprise an assembly of discrete LEDs, made using 2D or 3D technology, of different size or with different parameters, each segment consisting of one or more of these LEDs positioned on a common carrier or multiple carriers that are positioned communally in one and the same package. The assembly is produced using a flip-chip method in which the contacts are transferred onto a common carrier providing n-contact as illustrated in FIGS. 3c and 3d, which show three segments $S_1$, $S_2$ and $S_3$ thus produced. The discrete elements are produced on the surface of elementary substrates 201 providing the n-contact, having an emissive portion 203 and a p-contact 202. The contact pads 101 (of the n-contact) and 102 (of the p-contact) are connected to means comprising a control circuit 300.

According to one variant of the invention, each segment of the electroluminescent light source comprises a set of $n_i$ discrete electroluminescent elements the number $n_i$ varying from one segment to another, at least for a portion of said segments. Thus, the luminous power emitted by each segment varies according to the segments and according to the number $n_i$ of elements contained therein.

The greater the number $n_i$ of elements, the higher the luminosity emitted by the segment.

According to one variant of the invention, the emission areas of said segments vary in ascending order, said segments are distributed randomly over a substrate or a carrier.

According to one variant of the invention, the emission areas of said segments vary by power of two or the number $n_i$ of discrete elements varies by power of two.

According to one variant of the invention:
the discrete elements have a p-n or p-i-n structure, with one n- (or p-) contact element at the substrate and one upper p- (or n-) contact layer, said segments being located on a first face of a substrate;
said substrate comprises, on the front face, a first series of n- (or p-) contact pads and a second series of p- (or n-) contact pads;
said substrate comprises conductive through-vias;
said upper p- (or n-) contact layer is connected to said conductive through-vias, and thus to the first series of p- (or n-) contact pads;
the n- (or p-) contact element being connected via the substrate to the second series of n- (or p-) contact pads.

Typically, the n- (or p-) contact element may be the core of a core/shell structure in a wire.

FIG. 4 is an illustration of this variant of the invention in which three segments $S_1$, $S_2$ and $S_3$ are shown:
segment $S_1$ includes 5 wires, NTi;
segment $S_2$ includes 3 wires, NTi;
segment $S_3$ includes 6 wires, NTi;

Each segment comprises discrete elements that are connected to one another by a common electrode and a conductive through-via.

More specifically, wires that may be of core/shell type are formed on the surface of a substrate 110 on the basis of nucleation pads 206. The core/shell structure comprises a core 212 that may be n-doped and an active structure 211 that may be covered with a p-doped outer layer. An upper electrode layer 213 allows various contiguous wires to be connected in parallel to one another.

Since emission takes place via the front face, the device may advantageously comprise a mirror layer 400 allowing as much light as possible to be redirected toward the front face.

The substrate 110 includes conductive through-vias 111. An insulating layer 207 allows the p-type contacts, schematically represented by the pads 121, to be insulated from the n-type contacts that are provided by the pads 122. The substrate 110 also includes insulating portions 112, allowing the segments to be insulated from one another.

A control circuit 310 allows segments to be connected to one another independently.

Thus, the connection lands may be formed on the back face, potentially by means of a TSV (through-silicon via) method.

In general, TSVs allow metal interconnections that pass through the (wafer or chip) silicon layers to be made. Depending on the application, the diameters of the TSVs vary between 1 and 100 µm and have aspect ratios, corresponding to the ratio of their height to their width, of between 1 and 30.

In order to obtain reasonable and achievable aspect ratios, it is generally necessary to thin the silicon wafers (or chips) to thicknesses of less than 100 µm (the initial thickness of a silicon wafer being of the order of 725 µm).

According to one variant of the invention, the electroluminescent light source includes:
segments that comprise groups consisting of wires that are electrically connected to one another;
said groups of one and the same segment not being distributed contiguously and potentially being distributed randomly.

According to one variant of the invention, the discrete electroluminescent elements of one and the same group are connected to one another by a common upper electrode.

According to one variant of the invention, the groups of one and the same segment are connected electrically to one another on the face referred to as the back face of the substrate opposite said first face bearing said groups.

FIGS. 5a and 5b illustrate an exemplary electroluminescent light source comprising segments, some of which themselves comprise subsets of discrete 3D elements, referred to as groups.

According to this example, the light source comprises, as shown in the schematic view from above of FIG. 5a:
a first segment including three groups $G_{1,1}$, $G_{1,2}$ and $G_{1,3}$ consisting of contiguous discrete elements;
a second segment $S_2$ consisting of contiguous discrete elements;
a third segment comprising two groups $G_{3,1}$ and $G_{3,2}$ consisting of contiguous discrete elements;
a fourth segment $S_4$ consisting of contiguous discrete elements.

The various grayscale values represent the common electrical connections in one and the same segment on the face referred to as a front face, namely on the surface including the discrete elements NTi.

FIG. 5b schematically represents a view of the back face of the substrate bearing the elements NTi and shows the connections on the back face for one and the same segment including multiple groups. Thus, the connection $CG_1$ electrically connects the three groups $G_{1,1}$; $G_{1,2}$ and $G_{1,3}$ to one another and the connection $CG_3$ electrically connects the two groups $G_{3,1}$ and $G_{3,2}$ to one another.

From an electrical standpoint each segment is akin to an individual LED. The segments may thus be likened to an equivalent number of individual LEDs that are generally connected, or can be connected, in parallel. However, the light source of the invention may have a more complex connection scheme of series/parallel type. This makes it possible to obtain, in particular, lighting modules having higher operating voltages. FIGS. 6a and 6b illustrate by way of example two possible connection schemes for producing a light source D1 according to the present invention. FIG. 6a shows multiple segments 26 in parallel, each segment consisting of multiple groups 27 in series. FIG. 6b shows multiple segments 28 in series, each segment consisting of groups 27 in parallel.

According to one variant of the invention, the electroluminescent light source comprises a set of electroluminescent segments that are capable of emitting in different wavelengths $\lambda_{kc}$ the combination of said segments producing an overall luminance parameter resulting from the sum of the luminance parameters of each of the electroluminescent segments emitting in one of said wavelengths $\lambda_{kc}$.

This variant of the invention may prove to be particularly advantageous when it is sought to produce electroluminescent light sources that emit white light and when it is sought to control the surface distribution of the emitted power in order to control the perceived color.

The advantage of the light source of the invention resides in the segmentation of the active areas which also constitute a means for decreasing dispersions in the performance of the LED chips or for modifying them on demand, the adjustable specifications potentially being:
the overall threshold voltage of the LED;
the overall luminance of the LED;
the spatial uniformity of the luminance;
the bias current for a given luminance.

Exemplary Luminance Calibration:

At the end of the production line, the LEDs may exhibit a substantial dispersion in their parameters, such as for example luminance. This means that for one and the same bias current, the obtained luminance varies between 0 and $L_{max}$. However, the LED specifications dictate that it is permissible to sell only those LEDs the luminance L of which is such that:

$$L_{spec\_min} < L < L_{spec\_max}$$

and where $L_{spec\_min} = L_{spec\_nom} - \Delta L$ and $$L_{spec\_max} = L_{spec\_nom} + \Delta L.$$

$L_{spec\_nom}$, $L_{spec\_min}$ and $L_{spec\_max}$ being target nominal luminance, target minimum luminance and target maximum luminance values, respectively.

FIG. 7 is a representation of the statistical distribution of luminance production of a light source with an active area S.

It may thus be seen that only the portion of the population located between $L_{spec\_min}$ and $L_{spec\_max}$ is to be retained. All of the other units must be rejected.

In the case of a light source of segmented area S having all of its segments lit, the spectral distribution is identical since the overall area is the same. All of the LEDs having an overall luminance of less than $L_{spec\_min}$ are rejected since the luminance measured is the maximum luminance (all of the segments are lit).

All of the LEDs having a luminance of more than $L_{spec\_max}$ must also be rejected. The invention proposes a solution allowing all of these components to be brought within the range [$L_{spec\_min}$; $L_{spec\_max}$] by switching off a certain number of segments. The required level of precision for adjusting the component is $2*\Delta L = L_{spec\_max} - L_{spec\_min}$. Let N be the number of segments constituting the LED. If $N \geq L_{max}/(2*\Delta L)$, then it is possible to re-center all of the luminances that are higher than $L_{spec\_max}$ so that they fall within the desired range by switching off the required number of segments. The areas T and T', corresponding to the statistical distributions in production of a light source before and after selective addressing, and which are shown in FIG. 7, may thus be made identical.

Various scenarios are then possible when it comes to dimensioning the segments. These may be identical in size allowing an adjustment of the luminosity to be quite uniform, giving then $N \geq L_{max}/(2*\Delta L)$.

However, if it is desired to minimize the number of segments, it is possible for example to employ a binary dimensioning of the segments.

Let n be an integer such that $2^{n-1} < (L_{max} - L_{spec})/\Delta L < 2^n$, then it is possible to divide the LED into n+2 groups: a main group having a theoretical luminosity of $L_{spec\_nom}$ and n+1 groups of sizes 1, 2, 4, ..., $2^n$.

Thus, when only the main group is supplied with power, the theoretical luminance obtained is $L_{spec\_nom}$, the n+1 groups making it possible to have a luminance of between $L_{spec\_nom}$ and $L_{max}$.

By virtue of the present invention, all of the components having a luminance that is higher than the acceptable limit may thus be re-centered around the nominal value by disconnecting the required number of segments.

In production test phases, various methods are possible for calibrating the LED:

a method of systematically individually measuring all of the segments, subsequently making it possible to calculate the combination required to obtain nominal luminance;

a method of successive approximation until obtaining the final value.

These test methods make it possible to define which segments must be switched on and which others must remain off once the LED is packaged. It is therefore necessary to go through a programming phase before, during or after final assembly.

Spectral Distribution of the LEDs

Adjusting the actual luminance of the LED around its desired nominal value, by switching off a certain number of segments, may lead to a deterioration of the spectral uniformity of the LED. This deterioration may be problematic if it becomes visible to the naked eye or if the application in which the component is used requires a high level of spectral uniformity (car headlamp for example).

In order to limit this phenomenon, it is advantageously possible to divide the N segments described into P sub-segments or groups as described above so that the total number of lighting units Q is Q=P*N. Thus each segment consists of a multiple of sub-segments or groups.

By uniformly distributing these groups constituting a segment over the entire active area of the overall LED of area S it is possible to improve the lighting uniformity of the LED. When one segment is switched off, the overall luminance is decreased more uniformly.

One particularly advantageous case in this sense is that of LEDs consisting of wires since in general many thousands to many hundreds of thousands of wires are required per chip. This may be likened to an equivalent number of mini-segments connected in parallel.

However, one variant of the invention consists a contrario in using the segmentation of the LED to control the emission spectrum of the LED and to control the properties of the emission profile of each chip.

The emission profile depends on a certain number of perfectly reproducible parameters: the geometry of the chip, the shape of the package, the electrical connections of the chip (wire bonding or flip-chip), etc. These parameters may modify the waveform of the light emitted due to shadow effects for example.

By virtue of the present invention it becomes possible to switch on and off certain segments in order to compensate for these parameters. It is thus possible for example to increase the contribution of the center with respect to certain edges or vice versa.

Another subject of the invention is therefore a method for adjusting the spatial distribution of the luminance of an electroluminescent light source according to the invention, characterized in that it comprises the following steps:

determining a reference spatial distribution of a luminance parameter of said light source;

selectively controlling segments of discrete electroluminescent elements of different emission areas so as to obtain a luminance parameter surface distribution that is equal to said reference spatial distribution.

Programming the LEDs

The invention also proposes various methods for programming the LEDs and storing "on" or "off" information for each segment.

The light source is an LED component. Like any LED component, the light source possesses at least two electrical power supply terminals, one representing the anode and the other the cathode. This LED component is composed of lighting segments. These segments may also be divided into groups. One of the principles of the invention is to be able to select which segments will be supplied with electricity.

One of the proposed configurations is that the segments are electrically connected in parallel. They may therefore have one of their power supply terminals in common, for example the anode. This common connection of one of their terminals may be made on the front face of the substrate containing the LEDs via a general metal connection.

The segments can then be selected by individually connecting their second electrical terminal.

According to one variant of the invention, the connection of this second terminal is made physically when packaging the LED. Each segment possesses, preferably on the edge of the chip, a metal termination referred to as a "pad". It is sufficient to connect, or not to connect, each pad by means of wire bonding to the overall pad corresponding to the second terminal of the package of the LED component so that the segment is switched on or off, respectively.

According to one variant of the invention, the connection of this second terminal may be made via a network of metal tracks. The electroluminescent light source then comprises an assembly of LED components and a circuit of electrical interconnections of said LED components.

Each track is connected to one of the power supply terminals of each segment at one end and ends on a metal pad at its other end. According to the same principle as the preceding variant, the pads connected to the segments that are to be lit may be connected, or not connected, to the overall pad of the package by means of wire bonding.

According to one variant of the invention, this network of interconnections may also establish the electrical connection between the groups of one and the same segment.

According to another variant of the invention, the conductive tracks include programmable mechanisms that allow pre-established connections to be selectively destroyed, potentially of fusible metal element type. In this case, the desired segments are not selected by connecting a group. Instead, all of the segments are a priori connected and the segments that are not to be lit are disconnected by destroying this programmable mechanism.

According to one variant of the invention, this mechanism may be destroyed by applying a source of electrical energy (for example a current source) to its terminals, injecting enough energy (for example a current) thereinto to destroy it.

According to another variant of the invention, this mechanism may be destroyed by applying a source of light energy (for example a laser), producing enough local heating to destroy it.

According to one variant of the invention, the light source of the invention comprises at least one control circuit including means for independently activating a variable number of segments of different emission areas and allowing said luminance parameter of said source to be adjusted.

According to one variant of the invention, said control circuit comprises binary control means.

According to one variant of the invention, the control circuit is a printed circuit board including conductive tracks that are linked to said segments and an electronic control module, said module allowing at least a portion of said segments comprising the discrete electroluminescent elements to be activated via the conductive tracks.

According to one variant of the invention, the electronic control module includes a directory of data pairs: control tracks/overall luminance parameter of said device.

According to one variant of the invention, the electronic control module may be directly connected to the LED chip by way of chip-to-chip assembly that requires no conductive tracks.

In general, the present invention addresses the problem of variability in the luminance parameter of an electroluminescent light source including a set of discrete electroluminescent elements, which may be planar elements or filamentous, conical, frustoconical or pyramidal elements.

Thus, such a light source comprising a set of discrete elements has, in general, a total luminance parameter that is equal to the sum of the luminance parameters of each of the discrete electroluminescent elements.

In order to obtain electroluminescent light sources with a very high level of reproducibility, taking the variations in elementary luminance parameters into account, an electroluminescent light source is proposed in the present invention that comprises segments comprising at least one discrete electroluminescent element having an emission area, where at least a portion of said segments having emission areas that differ between said segments and/or a number of discrete electroluminescent elements that differs between said segments;

and at least one control circuit including means for addressing a variable number of segments, allowing said luminance parameter of said electroluminescent device to be adjusted, or a control circuit in which connecting circuits have been defined beforehand.

Thus, electroluminescent segments of variable size that may advantageously vary by power of two so as to decrease the number of commands, combined with means for independently controlling certain segments, make it possible to adjust an overall luminance parameter using an optimized command and thus make it possible to have an adjustable electroluminescent light source that is able to accord with predefined scope statements.

The control circuit may for example conventionally comprise a printed circuit board including a set of conductive tracks and interfaces allowing the power required to activate the segments comprising the discrete electroluminescent elements to be supplied. The control circuit may additionally also comprise an electronic control module that may be based on microprocessors and digital circuits.

According to the present invention, the control circuit may advantageously comprise binary control means, which do not require variations in power in order to supply the set of individual electroluminescent elements. Indeed, according to the present invention, it becomes possible, with binary control and a minimum number of command lines, to continuously cover a wide adjustment range in terms of L(I), L(V) or Lmax, etc.

In the phase of testing the obtained luminance parameters, performed by probe for example, it is possible to scan and to provide a user with optimum layout combinations for a given set of criteria. The user may thus have these combinations available for reproducing combinations of interest: in particular, such combinations may be used when wire-bonding chips within packages.

Exemplary Method for Adjusting an Electroluminescent Light Source Emitting White Light Multiple technologies currently exist that allow LEDs that emit white light to be obtained. One direct method of implementation consists in combining three LEDs emitting in the red, the green and the blue, respectively. However, controlling the various sources can prove to be tricky, to the extent that the red, green and blue radiation must be combined in very precise proportions in order to obtain the "best" possible white.

In general, the color of a light source is compared to that of a theoretical black body heated to between 2000 and 10 000 K, which would have an emission spectrum in the visible light range similar to the color in question. The apparent color of a light source varies from the orange-red of a candle flame (1850 K) to bluish in the case of an electronic flash (between 5000 and 6500 K depending on the manufacturer).

In order to gauge the appearance and the quality of light, the color rendering index or CRI, a figure between 0 and 100% that qualifies color appearance, should be combined with the color temperature.

In the case of a white LED, a color temperature varying from warm white to cool white, measured in kelvin (K), is spoken of. Warm white is therefore a white color approaching the color of a halogen or incandescent bulb and is located at a value between 2500 K (very yellow) and 3500 K (less yellow) while a cool white varies between 6000 K (slightly cool white) and 7000 K (very cool white). White therefore covers a very wide range of color temperatures. In general, the human eye starts to perceive a white as cold from 6000 K on (between 6000 K and 7000 K). The higher the kelvin number (K) the colder and bluer the color. Daylight white is located at a value of between 5000 K and 6000 K; it is the most neutral white there is and is certainly one of the most valued, since it makes it possible to readily discern the actual colors of objects present in ambient atmosphere.

In order to obtain an electroluminescent light source that emits in the white and does so in a reproducible manner, it is necessary to have optimum control over the various weightings of the various colors.

According to the present invention, it becomes possible to provide a good level reproducibility on the basis of determining an average luminance resulting from the weighting of the different segments emitting in the red, the green and blue after the test phase and reproducing the combinations of connections that provide a resulting predefined average luminance.

It is also possible to envisage operation using three power supplies, one per color, or else using a single power supply. The emission wavelength may be adjusted through the use of alloys based on InGaN for example, and comprising different compositions allowing the desired emission wavelength to be adjusted.

The combinations of segments of discrete electroluminescent elements and of different emission colors may be produced by organizing, or by randomly distributing, said segments over the entirety of a substrate or over the entirety of a carrier.

Each segment may be interconnected in a different manner in order to adjust the colorimetry actively (possibility to adjust the color on command) or passively (the combination has been set beforehand).

Indeed, in general, the electroluminescent light source of the invention may be completed by way of various methods.

From a set of segments of discrete electroluminescent elements, it is possible to seek, during the probe test, the combination of segments that results in the desired characteristic in terms of target luminance parameter. The combination of connections making it possible to obtain said target luminance linked to the generally required scope statement is then defined. This combination of connections may then be used during the later step of wire-bonding the chip within the package.

It is possible to have a single connection pad, if the set of connections has been established beforehand, and it is then possible to destroy the link with the groups that are not used by means of a fusible system. It is also possible to form the link with the groups that are used by means of a matter deposition system (inkjet, etc.).

According to the present invention, it is also possible for a customer to produce the electroluminescent light source after delivery of LED components and assemble it using suitable electrical interconnections between components, instructions for which are also provided to him or her.

The invention claimed is:

1. An electroluminescent light source with an adjusted or adjustable luminance parameter wherein:
   said source comprises a light-emitting diode having an emissive active portion that is segmented so as to define a set of segments, each segment comprising a discrete electroluminescent element or multiple discrete electroluminescent elements connected permanently to one another and having an emission area, wherein a number of discrete electroluminescent elements for each of the segments varies among the segments;
   at least a portion of said segments has different emission areas;
   said source comprising means for controlling at least a portion of said segments.

2. The electroluminescent light source as claimed in claim 1, wherein said source comprises filamentous, conical, frustoconical or pyramidal elements on a surface of a substrate and distributed in subsets referred to as segments.

3. The electroluminescent light source as claimed in claim 1, wherein said light-emitting diode comprises a planar structure of stacked layers on the surface of a substrate.

4. The electroluminescent light source as claimed in claim 1, wherein said source comprises an assembly of discrete light-emitting diode chips, distributed in multiple segments, each segment consisting of at least one chip.

5. The electroluminescent light source as claimed in claim 2, wherein each segment possesses a different number of filamentous, conical, frustoconical or pyramidal elements.

6. The electroluminescent light source as claimed in claim 3, wherein the segments have different areas.

7. The electroluminescent light source as claimed in claim 4, wherein the segments comprise a different number of light-emitting diodes or light-emitting diodes of different sizes.

8. The electroluminescent light source as claimed in claim 5, comprising a series of N th segments, the number of filamentous, conical, frustoconical or pyramidal elements in each N th segment varying by power of 2, where N>2.

9. The electroluminescent light source as claimed in claim 6, comprising a series of N th segments, the size of the th segments varying by power of 2, where N>2.

10. The electroluminescent light source as claimed in claim 6, comprising N th segments and an assembly of discrete light-emitting diode chips, the chips constituting the N th segments have areas that vary by power of two, and/or in that the number of chips constituting a th segment varies by power of 2, where N>2.

11. The electroluminescent light source as claimed in claim 1, wherein at least a portion of said segments consists of groups positioned non-contiguously, said groups being connected permanently to one another.

12. The electroluminescent light source as claimed in claim 11, wherein said groups constituting the segments are positioned randomly.

13. The electroluminescent light source as claimed in claim 2, wherein the filamentous, conical, frustoconical or pyramidal elements are connected electrically by means of a common upper electrode.

14. The electroluminescent light source as claimed in claim 1, wherein the segments are connected by multiple metal levels on a processed face of the chips assembled according to a flip-chip method.

15. The electroluminescent light source as claimed in claim 4, wherein the light-emitting diode chips constituting the segments are transferred onto a carrier that also electrically connects the segments and groups.

16. The electroluminescent light source as claimed in claim 13, wherein each group of filamentous, conical, frustoconical or pyramidal elements of one and the same segment is connected to at least one via passing through the substrate and allowing the groups of said segment to be connected on a back face.

17. The electroluminescent light source as claimed in claim 1, wherein the control means comprise a control circuit including means for independently activating a variable number of segments and allowing said luminance parameter of said source to be adjusted.

18. The electroluminescent light source as claimed in claim 17, wherein the control circuit is a printed circuit board including conductive tracks that are linked to the segments and an electronic control module, said module allowing at least a portion of said segments to be activated via the conductive tracks.

19. The electroluminescent light source as claimed in claim 18, wherein said control circuit comprises binary control means.

20. The electroluminescent light source as claimed in claim 19, wherein the electronic control module includes a directory of data pairs: layout of the control tracks/overall luminance parameter of said source.

21. The electroluminescent light source as claimed in claim 18, wherein the conductive tracks include means for selectively and permanently programming the pre-established connections, said means potentially being metal fusible elements.

22. The electroluminescent light source as claimed in claim 17, wherein the control means comprise a control circuit including conductive tracks connecting each segment to one or more metal pads enabling the wire bonding thereof when packaging said source.

23. A method for designing an electroluminescent light source as claimed in claim 21, wherein the metal fusible elements are removed by means of laser ablation.

24. The electroluminescent light source as claimed in claim 1, wherein the segments are capable of emitting in different wavelengths $\lambda_{pk}$, the combination of said segments producing an overall luminance parameter resulting from the sum of the luminance parameters of each of the segments emitting in one of said wavelengths $\lambda_{pk}$.

25. A method for adjusting a luminance parameter of an electroluminescent light source as claimed in claim 1, comprising the following steps:
  determining a reference luminance parameter value of said electroluminescent light source;
  selectively controlling segments of different emission areas of discrete electroluminescent elements so as to obtain said reference luminance parameter.

26. A method for adjusting the spatial distribution of a luminance parameter of an electroluminescent light source as claimed in claim 1, comprising the following steps:
  determining a reference spatial distribution of a luminance parameter of said electroluminescent light source;
  selectively controlling segments of different emission areas of discrete elements so as to obtain a luminance parameter surface distribution L(x,y) that is equal to said reference spatial distribution.

27. A method for optimizing control of an electroluminescent light source as claimed in claim 1, comprising:
  a test phase including the following steps:
    determining a directory of data pairs: configuration of layout of conductive tracks/measurement of overall luminance parameter of said electroluminescent light source;
    selecting, in said directory, conductive track layout configurations allowing luminance parameters that are in accordance with predefined luminance parameter specifications to be obtained;
  determining an optimum layout configuration that meets the predefined specifications.

28. A method for designing an electroluminescent light source as claimed in claim 1, comprising:
  a step of determining reference specifications of said electroluminescent light source;
  producing a control circuit including a network of conductive tracks that are intended to activate the set of segments of discrete electroluminescent elements of said electroluminescent light source;
  removing a subset of connections so as to be able to activate a selection of segments of discrete electroluminescent elements in order to obtain said reference specifications.

* * * * *